United States Patent [19]

Hughes

[11] Patent Number: 4,733,205
[45] Date of Patent: Mar. 22, 1988

[54] ELECTRICAL FILTER
[75] Inventor: John B. Hughes, Hove, England
[73] Assignee: U.S. Philips Corporation, New York, N.Y.
[21] Appl. No.: 40,897
[22] Filed: Apr. 21, 1987
[30] Foreign Application Priority Data
  Apr. 30, 1986 [GB] United Kingdom ................. 8610562
[51] Int. Cl.$^4$ ...................... H03H 7/075; H03H 7/06; H03H 11/12
[52] U.S. Cl. .................................. 333/172; 333/168; 333/173; 330/9; 330/109
[58] Field of Search ............... 333/167, 168, 172, 173, 333/174, 19, 20; 330/9, 109, 110; 364/724, 825; 328/151, 167

[56] References Cited
U.S. PATENT DOCUMENTS
  4,114,117 9/1978 Ford ................................ 333/172 X Primary Examiner—Marvin L. Nussbaum
Attorney, Agent, or Firm—Robert T. Mayer; Bernard Franzblau

[57] ABSTRACT

A continuous time electrical filter fabricated as an integrated circuit includes capacitors (CF,CN) and resistors (R1,R2). Since capacitors and resistors are difficult to integrate with accurately defined values, a trimming circuit is provided which operates switches (S1–SN) to select appropriate ones of the capacitors (CN) to accurately define the cut-off frequency of the filter. The trimming circuit comprises a capacitor (TC2) which is charged through a resistor TR1 during a first period and which is discharged in incremental steps by capacitor (TC1). The number of incremental steps is counted by a counter (11) and transferred to a register (13). The outputs (S1–SN) of the register (13) control the switches (S1–SN). Alternatively the values of the filter resistors may be adjusted, a convenient procedure being to short out selected portions of the resistors. More than one capacitor or resistor may be adjusted using a single counter and register. The trimming circuit also includes a switch (TS11) which connects the parasitic capacitance (CP1, CP2) of the capacitor (TC1) and an underlying conductive layer (22) and of a dummy resistor and the underlying layer (22) in parallel with the capacitor (TC1). The filter circuit is arranged so that the parasitic capacitance between the resistor (R1) and an underlying conductive layer and that between the capacitors (CF, CN) and the underlying conductive layer are connected in parallel with the fixed capacitor CF.

11 Claims, 17 Drawing Figures

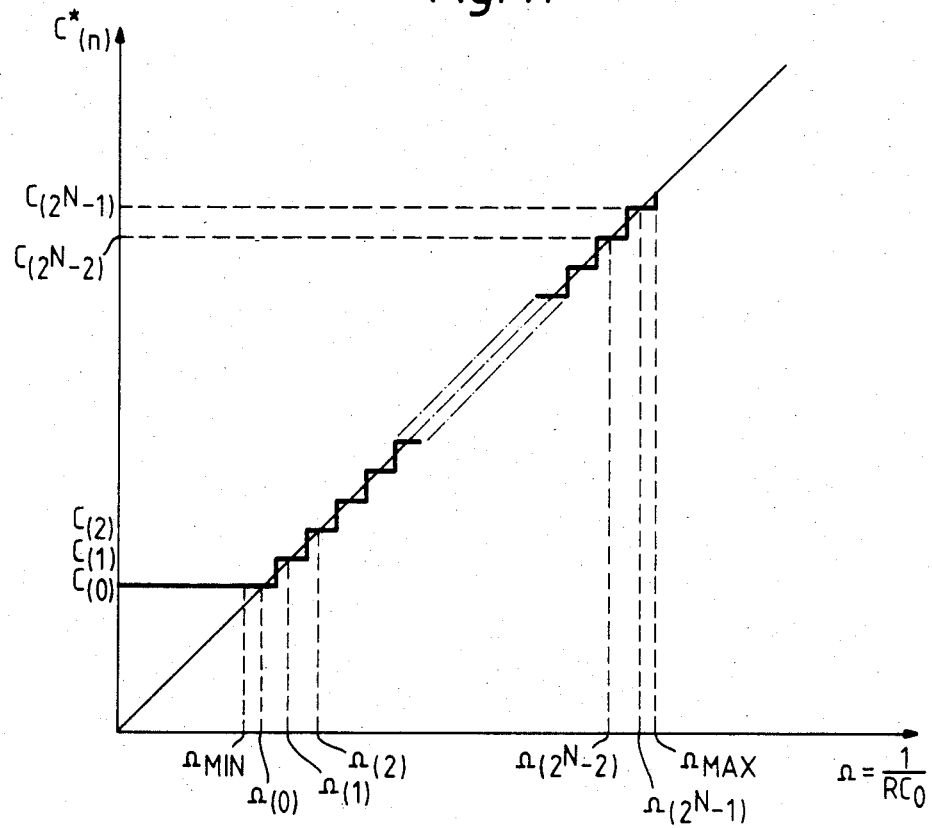

ELECTRICAL FILTER

BACKGROUND OF THE INVENTION

The invention relates to an integrated electrical filter comprising at least one capacitor, at least one resistor, and a trimming circuit for adjusting the value of the product of the resistance of the resistor and the capacitance of the capacitor.

Both active and passive filters may be constructed using one or more capacitors and resistors. The filters may have high pass, low pass, band pass, band stop, and all pass characteristics. Low pass filters may be used as input filters for switched capacitor filters which, because they are sampled data filters, require the input signal to be band limited to prevent aliasing. Switched capacitor filters are being increasingly used due to their relative ease of integration. Similarly low pass filters are required as input filters for any signal processing circuits using sampled data techniques, e.g. other switched capacitor circuits and CCD circuits.

However, resistors and capacitors in integrated form have only a limited accuracy which prevents continuous time RC filters from having a closely defined, repeatable characteristic. Consequently it has been the general practice to use a discrete component filter in front of an integrated switched capacitor circuit or to use a much higher clock frequency which tends to increase the power dissipation. This, however, increases the cost of a system and consequently it is desirable to find a method of satisfactorily integrating a continuous time filter.

An integrated continuous time filter in which a more accurate RC time constant may be achieved is described in a paper entitled "Switched Resistor Filters. A Continuous Time Approach to Monolithic MOS Filter Design" by R. L. Geiger, P. E. Allen, and D. T. Ngo published in IEEE Transactions on Circuits and Systems, Vol. Cas-29, No. 5, May 1982, pages 306–315. This paper describes a filter in which each resistor is formed by field effect transistors (FETs) whose resistance is determined by the charge stored in, and hence the voltage across, a capacitor connected between their gate and source electrodes. Each resistor is formed by two FET's, only one being switched into the filter at a time, the other being connected in a trimming circuit which adjusts the voltage across the capacitor so that the resistance of the FET is made equal to the equivalent resistance of a switched capacitor. Thus when the FET is switched into the filter circuit the time constant of the filter capacitor and resistor depends only on the ratio between the switched capacitor and the filter capacitor and the clock frequency at which the switched capacitor is switched. When two or more capacitors are formed in a single integrated circuit it is comparatively straightforward to obtain an accurate ratio between the capacitance values. The clock frequency can also be defined accurately as it will normally be generated by an external circuit.

However, this known filter has the disadvantage that the resistance of the FETs have a non-linear relationship to the control voltage and this gives rise to inaccuracies in the resistance values. Also the resistance of different FETs for equal gate-source voltages are found to vary significantly due to differences in the voltages on the drain electrodes and on the back gates. Since the resistance of the FET is influenced by the source drain voltage the input signal will case modulation of the FET resistance, thus varying the filter characteristics with input signal amplitude. Further the use of two FETs for each resistor, only one of which is used at any instant, may give rise to crosstalk between the clock signals used for switching.

U.S. patent application Ser. No. 828,004 discloses an integrated electrical filter in which the trimming circuit comprises means for charging a further capacitor from a reference voltage source through a further resistor for a first period, means for removing the charge from the further capacitor in discrete increments during a second period, means for counting the number of increments required to remove the charge accumulated on the further capacitor during the first period, and means for adjusting the value of said at least one capacitor or said at least one resistor in dependence on the number of increments counted.

This filter has the advantage that the value of real resistors or capacitors is adjusted, thus avoiding the problems associated with the non-linear response of the FETs.

However, this filter does not take into account parasitic capacitances between the resistors and capacitors and the substrate.

SUMMARY OF THE INVENTION

It is an object of the invention to enable the provision of an integrated electrical filter in which the trimming circuit is arranged to compensate for the effects of at least some of the parasitic capacitances.

The invention provides an integrated electrical filter as set forth in the opening paragraph characterised in that the trimming circuit comprises means for charging a further capacitor from a reference voltage source through a further resistor for a first period comprising $2^N$ periods of a clock signal, where N is a first integer, means for removing the charge from the further capacitor in discrete increments during a second period comprising $2^N+P$ periods of the clock signal, where P is a second integer, first connection means for connecting the stray capacitance formed between the further capacitor and an underlying conductive layer in parallel with the further capacitor for a third period which comprises the first P periods of the clock signal occurring during the second period, means for counting the number of increments required to remove the charge accumulated on the further capacitor during the first period, and means for adjusting the value of said at least one capacitor or said at least one resistor in dependence on the number of increments counted.

By forming the capacitors over a conductive layer the parasitic capacitances between the capacitors and the conductive layer can be electrically connected in parallel with the fixed capacitors. The value of the further capacitor plus its parasitic capacitance can then be taken into account by the trimming circuit. Provided that all of the capacitors are formed by the same process steps and are similarly formed over a conductive layer, then they will have ratioed parasitic capacitances with which they can be connected in parallel and hence the trimming circuit will compensate for the parasitic capacitances involved.

The filter may comprise second connection means for connecting the stray capacitance between the further resistor and an underlying conductive layer in parallel with the first capacitor for the third period. The first and/or second connection means may comprise a switch.

This enables the stray capacitance between the further resistor and its underlying conductive layer to be compensated for.

A continuous conductive layer may underlie both the further capacitor and the further resistor, the first and second connection means comprising a switch connecting the underlying layer to the plate of the capacitor remote from the underlying conductive layer.

In a filter in which said at least one capacitor comprises a fixed capacitor and N associated capacitors, each of the N associated capacitors being connected in parallel with the fixed capacitor via a respective associated switch, the operation of the associated switches being controlled by said adjusting means, the fixed and associated capacitors may be formed above a continously extending conductive layer and means may be provided for connecting the stray capacitance between the fixed capacitor and the underlying conductive layer and between the associated capacitors and the underlying conductive layer in parallel with the fixed capacitor.

The at least one resistor may be formed above the same conductive layer as the at least one capacitor and means may be provided for connecting the capacitance between the at least one resistor and the underlying layer in parallel with the fixed capacitor.

In this way the structure of the filter resistor and capacitor is of the same form as the further resistor and capacitor in the trimming circuit and the parasitic capacitances associated with the filter capacitor and resistor are connected in parallel with the fixed capacitor. Thus the value of the fixed capacitor can be chosen to take into account the nominal values of the parasitic capacitances.

The filter may comprise a plurality of resistors and capacitors forming a ladder network, the resistors forming the series elements and the capacitors the shunt elements, in which half of each resistor connected to a single capacitor is formed above the conductive layer associated with that capacitor.

The parasitic capacitance of the resistor is distributed but by dividing the resistors in this way an approximation to lumped capacitors is obtained. These approximate lumped capacitances are then connected in parallel with the appropriate fixed capacitor.

Each resistor may have the same dimensions, the resistance value being selected by connecting at selected points within its area.

This enables networks to be produced in which the parasitic capacitances of the resistors have the same value regardless of the desired resistance of the resistor.

BRIEF DESCRIPTION OF THE DRAWINGS

Embodiments of the invention will now be described, by way of example, with reference to the accompanying drawings, in which:

FIG. 4 shows a discrete approximation to the ideal compensation characteristic for the filter of FIG. 2.

DESCRIPTION OF THE PREFERRED EMBODIMENTS

Figure 1:
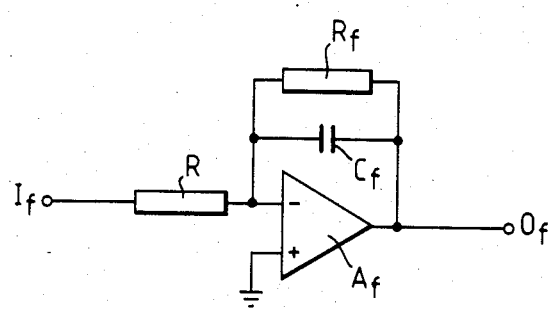
FIG. 1 shows a known first order active low pass filter.

FIG. 1 shows a simple first order active filter having an input $I_f$ which is connected through a resistor $R_i$ to the junction of the inverting input of a differential amplifier $A_f$, a capacitor $C_f$, and a resistor $R_f$. An output $O_f$ of the filter is connected to the junction of the output of the differential amplifier $A_f$, the capacitor $C_f$ and the resistor $R_f$. The non-inverting input of the differential amplifier $A_f$ is connected to ground. The filter shown is a well known conventional active filter and its response is given by $$H(s) = -\frac{A}{1 + s/w_{co}}$$

where $w_{co}$ (The $-3$ dB cut-off frequency of the filter)$= 1/R_f C_f$

Clearly any spreads in the value of $R_f$ and $C_f$ will directly affect the cut-off frequency. It is well known that it is difficult to fabricate integrated resistors and capacitors accurately and consequently where an accurately specified cut-off frequency is required it has been common practice to use discrete component filters.

The filter referred to in the introduction has sought to overcome this problem by making a controlled adjustment of the resistance values in the filter. The arrangement shown in FIG. 2 allows a controlled adjustment of the capacitance values or if suitable modifications are made the resistance values.

Figure 2:
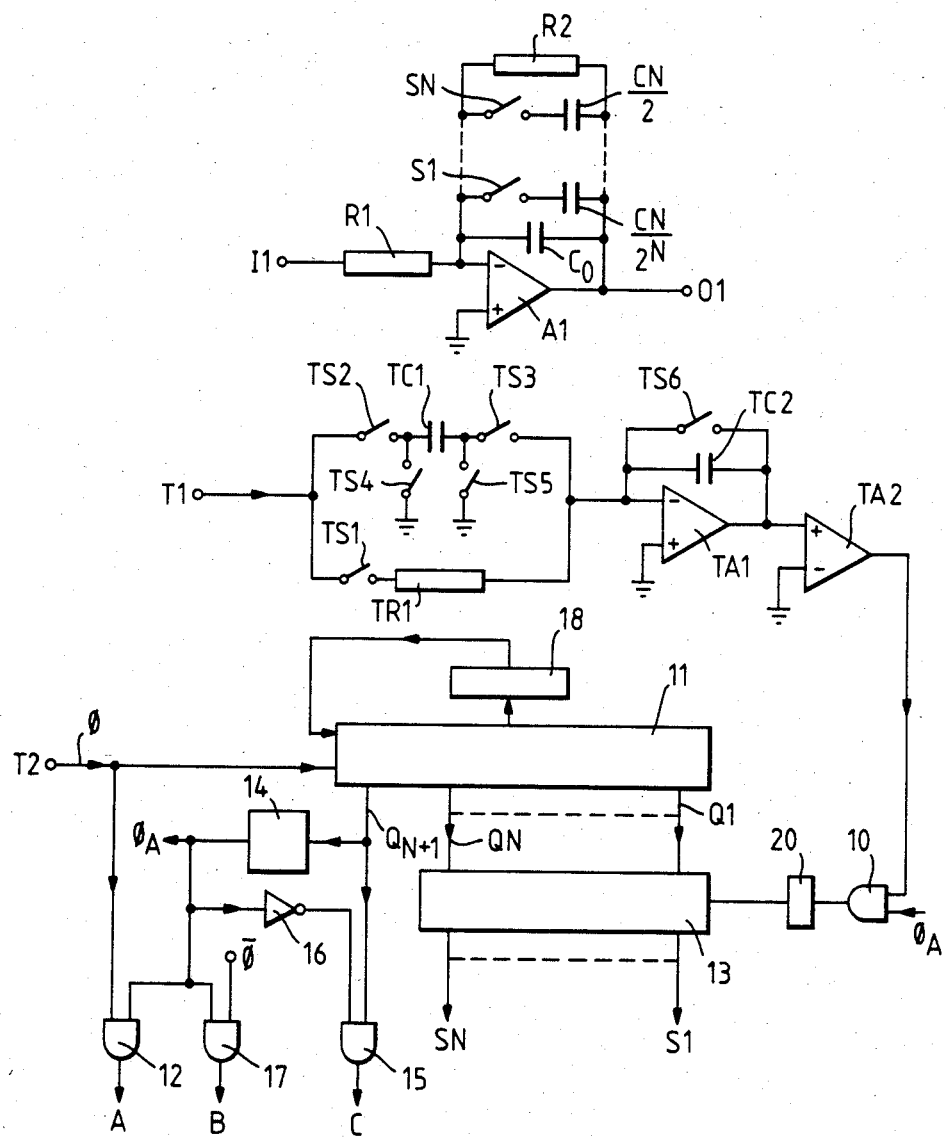
FIG. 2 shows a first embodiment of a first order active low pass filter including a trimming circuit for adjusting the product of a resistor and a capacitor.

As shown in FIG. 2 a first order active filter comprises an input $I1$ which is connected via a resistor $R1$ to the junction of the inverting input of a differential amplifier $A1$, a resistor $R2$, a capacitor $C0$, and to N series arrangements of a capacitor $CN$ and a switch $SN$, where N is an integer which is chosen to give the desired precision of cut-off frequency. The other end of the resistor $R2$, the series arrangements of capacitors CN and switches SN, and the capacitor CO are connected to the junction of the output of the differential amplifier A1 and an output terminal 01. The non-inverting input of the differential amplifier A1 is connected to ground.

This arrangement forms a first order active low pass filter. The capacitors CN have binary weighted values and can be selectively connected in parallel with capacitor CO by means of the switches S1 to SN, which switches are controlled, as described hereinafter, to be operated in such a manner as to closely define the cut-off frequency of the filter.

The rest of the circuit forms a trimming circuit for adjustment of the value of the filter capacitance by providing appropriate signals for controlling the operation of the switches S1 to SN. A terminal T1, to which, in operation, a reference voltage source is connected, is connected via a first switch TS1 to one end of a resistor TR1, the other end of which is connected to the inverting input of a differential amplifier TA1. The terminal T1 is also connected via a second switch TS2 to one plate of a capacitor TC1 whose other plate is connected via a switch TS3 to the inverting input of the amplifier TA1. A switch TS4 is connected between ground and the junction of the switch TS2 and the capacitor TC1, while a switch TS5 is connected between ground and the junction of the capacitor TC1 and the switch TS3. The non-inverting input of the amplifier TA1 is also connected to ground while its output is connected via the parallel arrangement of a capacitor TC2 and a switch TS6 to its inverting input. The output of the amplifier TA1 is connected to the non-inverting input of a differential amplifier TA2 whose inverting input is connected to ground. The output of the amplifer TA2 is connected to a first input of an AND gate 10. A terminal T2 which, in operation receives a clock signal, is connected to a clock input of a counter 11 and to a first input of an AND gate 12. The counter 11 has N parallel outputs Q1–QN which are connected to corresponding inputs of an N bit register 13. The counter 11 has a further output $Q_{N+1}$ which is connected to the clock input of a binary divider 14 and to a first input of an AND gate 15. The output of the divider 14 is connected to the input of an inverter 16, whose output is connected to a second input of the AND gate 15, to a second input of the AND gate 12, to a first input of an AND gate 17, and via a line $\phi_A$ to a second input of the AND gate 10. An inverted version of the clock signal applied to the terminal T2 is applied to a second input of AND gate 17. The outputs of AND gates 12, 17 and 15 on lines A, B, and C, respectively control the operation of switches TS2 and TS5; TS3 and TS4; and TS6, respectively. The output of inverter 6 provides a signal on line $\overline{\phi}_A$ which controls the operation of switch TS1. The outputs of the N bit register 13 on lines S1 to SN control the corresponding switches S1 to SN in the filter. The output of AND gate 10 is connected to the input of a pulse generator 20 whose output is connected to a load input of the N bit register 13 while a decoding circuit 18 decodes the output of the counter 11 and provides a reset signal for the counter 11 when a count of $2^N+P$ is decoded, as will be described hereinafter.

The operation of the arrangement will now be described with reference additionally to the waveforms shown in FIG. 3 and the characteristic shown in FIG. 4. Since the filter and trimming circuit are integrated together it can be arranged that the ratios of the capacitances of capacitors CO, CN, TC1 and TC2 are accurately defined as are the ratios of resistors TR1 and R2.

A reference voltage V, which may for example be the chip power supply voltage, is applied to terminal T1 while a clock signal $\phi$ is applied to terminal T2. At time $t_1$ the signal $\phi_A$ closes the switch TS1 and the signal C closes the switch TS6. Consequently capacitor TC2 is shorted and the voltage (v) at the output of amplifier TA1 is equal to OV. At time $t_2$ the switch TS6 is opened and the capacitor TC1 is left floating. The interval between $t_1$ and $t_2$ is arbitrary but for convenience is set to P cycles of the clock signal $\phi$. Between times $t_2$ and $t_3$ capacitor TC2 integrates the current I=V/TR1 to produce a negatively going ramp. The interval between times $t_2$ and $t_3$ is arbitrary but for convenience is set to $2^N$ cycles of the clock signal $\phi$. The value of the ramp at time $t_3$ is therefore given by $$v = \frac{1}{Co} \int_{t_2}^{t_3} I dt = -\frac{V(t_3 - t_2)}{R \cdot Co} = -\frac{V \cdot 2^N \Omega}{fc} \quad (1)$$

where
Co is the capacitance of capacitor TC2,
R is the resistance of resistor TR1,
fc is the frequency of the clock signal $\phi$, and
$\Omega$ is a characteristic frequency 1/RCo.

At time $t_3$ switch TS1 is opened and switches TS2, TS3, TS4, and TS5 are controlled by waveforms A and B which between times $t_3$ and $t_5$ are complementary to each other and change at the clock frequency fc. Consequently capacitor TC2 integrates the current from capacitor TC1 to produce a positively going staircase. Each increment in v is given by $$\delta v = V \cdot \frac{C1}{C0} \quad (2)$$

where C1 is the capacitance of capacitor TC1.

At time $t_4$ which is P cycles of the clock signal after time $t_3$ the counter 11 is reset. Capacitor TC2 continues to integrate current from capacitor TC1 and when the staircase crosses zero, i.e. v=O, AND gate 10 produces a signal which causes the pulse generator 20 to produce a short pulse to load the output of the counter into the N bit register 13. The pulse generator 20 is constructed to produce a short pulse in response to the signal transition from false to true at the output of the AND gate 10 and may be a monostable multivibrator or could alternatively be formed from clocked bistable circuits. The outputs S1 to SN of this register then control the switches S1 to SN of the filter to produce a more accurately defined cut-off frequency.

At time $t_5$ the $Q_{N+1}$ output of the counter 11 causes the signal $\phi_A$ to change state and the procedure to be repeated.

FIG. 4 shows the discrete approximation to the ideal compensation characteristic covering a spread in characteristic frequency $\Omega$ for the range $\Omega MIN \leq \Omega \leq \Omega MAX$.

Figure 3:
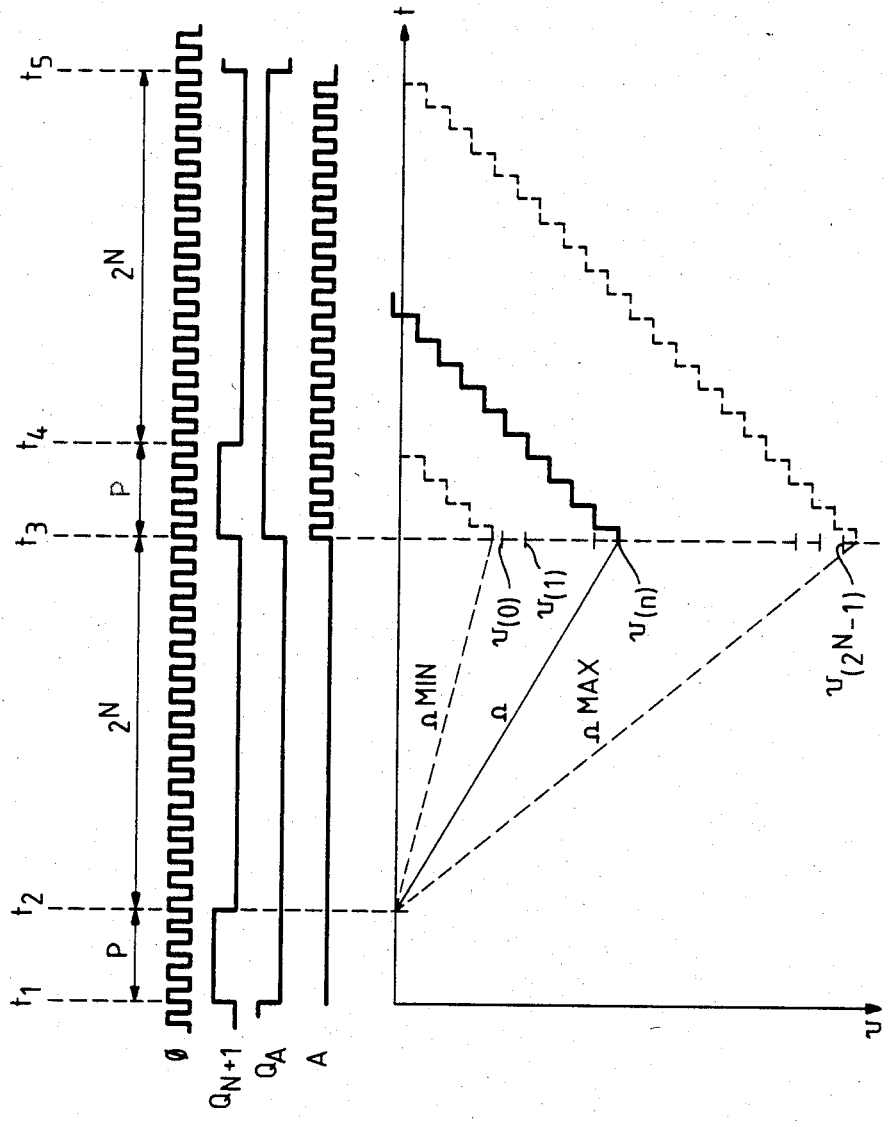
FIG. 3 shows various waveforms in the filter of FIG. 2.

As shown in FIGS. 3 and 4 $\Omega_{MIN}$ and $\Omega_{MAX}$ are the limiting values of $\Omega$ which can be compensated by the arrangement shown in FIG. 2. When $\Omega = \Omega_{MIN}$ it takes P cycles of the clock signal $\phi$ to increase v to zero. When $\Omega = \Omega_{MAX}$ it takes $P+2^N$ cycles of the clock signal $\phi$ to increase v to zero.

therefore $\dfrac{\Omega\,MAX}{\Omega\,MIN} = \dfrac{P + 2^N}{P} = 1 + \dfrac{2^N}{P}$ (3)

The approximate characteristic coincides with the ideal characteristic at $2^N$ points, i.e. at frequencies defined by (n) where $0 \leq n \leq 2^N - 1$.

and $\Omega(n) = \Omega_{MIN} + \dfrac{(n + \frac{1}{2})(\Omega_{MAX} - \Omega_{MIN})}{2^N}$ $= \Omega_{MIN} + \dfrac{(n + \frac{1}{2})\left(\dfrac{\Omega_{MAX}}{\Omega_{MIN}} - 1\right)\Omega_{MIN}}{2^N}$ Subs. for $\dfrac{\Omega_{MAX}}{\Omega_{MIN}}$ from (3)

$\Omega(n) = \Omega_{MIN} + \dfrac{(n + \frac{1}{2})\left(1 + \dfrac{2^N}{P} - 1\right)\Omega_{MIN}}{2^N}$ (4)

$= \Omega_{MIN}\left(1 + \dfrac{n + \frac{1}{2}}{P}\right)$

The term $n + \frac{1}{2}$ arises from a $\frac{1}{2}$ $\delta v$ offset used to minimise the deviation between the ideal and discrete characteristics.

From equation (1) the integrator output voltage at time $t_3$ is given by $v_{(n)} = \dfrac{-V \cdot 2^N}{fc} \Omega_{(n)}$ substituting for $\Omega_{(n)}$ from (4)

$v_{(n)} = \dfrac{-V \cdot 2^N}{fc} \Omega_{MIN}\left(1 + \dfrac{n + \frac{1}{2}}{P}\right)$ m cycles of the clock signal $\phi$ after time $t_3$ the integrator output voltage is $V_{(m)} = V_{(n)} + m \cdot \delta v$ After a further $m_{(n)}$ cycles of the clock signal $\phi$ after time $t_3$ the integrator output voltage for $\Omega_{(n)}$ reaches $+(\delta V/2)$ and the counter state is loaded into the register $M_{(n)} = \dfrac{\delta v}{2} - v_{(n)}$ (6)

For $n = 0$ $m_{(o)} = P + 1$

From (6) $m_{(o)} = P + 1 = \frac{1}{2} \cdot \dfrac{v_{(o)}}{\delta v}$ therefore $\delta v = \dfrac{-v_{(o)}}{P + \frac{1}{2}}$ Substituting for $v_{(n)}$ from (5) and putting $n = 0$ gives $\delta v = \dfrac{V}{P + \frac{1}{2}} \cdot \dfrac{2^N}{fc} \cdot \Omega_{MIN}\left(1 + \dfrac{n + \frac{1}{2}}{P}\right)$ (7)

$= \dfrac{V \cdot 2^N}{fc} \Omega_{MIN}$

Substituting for $v_{(n)}$ from (5) and $\delta v$ from (7) in (6) gives $m_{(n)} = \frac{1}{2} + \dfrac{\dfrac{V \cdot 2^N}{fc} \Omega_{MIN}\left(1 + \dfrac{n + \frac{1}{2}}{P}\right)}{\dfrac{V}{P} \cdot \dfrac{2^N}{fc} \Omega_{MIN}}$ $= \frac{1}{2} + \left(1 + \dfrac{n + \frac{1}{2}}{P}\right)P$ $= (P + 1) + n$ therefore $m_{(n)} = m_{(o)} + n$ (8)

Equation (8) shows that for processing characteristic $\Omega_{(n)}$ it takes n more cycles of the clock signal frequency $\phi$ for the output voltage v of the amplifier TS1 to reach $+(\delta v/2)$ volts. In other words the arrangement has measured $\Omega_{(n)}$. The counter state n is used to program the capacitor array (CO+CN) written hereinafter as C*(n) which is designed to produce the desired cut-off frequency $W^*_{CO}$.

The capacitor array is designed to give $C^*_{(n)} = \dfrac{C^*}{2^N}(P + n + \frac{1}{2})$ (9)

where the capacitance vaue of capacitor $C0 = \dfrac{C^*}{2^N}(P + \frac{1}{2})$ and the capacitance value of capacitors $CN = \dfrac{C^*}{2^N} \cdot n$ $\therefore w^*_{(n)} = \dfrac{1}{R^* C^*_{(n)}}$ where $R^*$ is the resistance of resistor $R2$ $\therefore w^*_{(n)} = \dfrac{2^N w^*}{P + n + \frac{1}{2}}$ (10)

where $w^* = \dfrac{1}{R^* C^*}$

From (4)

$n = P\left(\dfrac{\Omega_{(n)}}{\Omega_{MIN}} - 1\right) - \frac{1}{2}$ $\therefore w^*_{(n)} = \dfrac{2^N \cdot w^*}{P\left(\dfrac{\Omega_{(n)}}{\Omega_{MIN}}\right)}$ (11)

Note that $w^* = \dfrac{1}{R^* C^*}$ varies with processing spreads so $w^*_{MIN} \leq w^* \leq w^*_{MAX}$ and $w^*_{NOM} = \dfrac{w^*_{MIN} + w^*_{MAX}}{2}$ Now $w^* = w^*_{NOM} \times \dfrac{w^*}{w^*_{NOM}} = w^*_{NOM} \times \left(\dfrac{\Omega}{\Omega_{NOM}}\right)$ (12)

-continued where $\Omega_{NOM} = \dfrac{\Omega_{MIN} + \Omega_{MAX}}{2} = \dfrac{\Omega_{MIN}}{2}\left(1 + \dfrac{\Omega_{MAX}}{\Omega_{MIN}}\right)$ $$\therefore \dfrac{\Omega_{NOM}}{\Omega_{MIN}} = 1 + \dfrac{2^{N-1}}{P} \quad (13)$$

From (12)

$$w^* = w^*_{NOM}\left(\dfrac{\Omega}{\Omega_{MIN}}\right) \cdot \left(\dfrac{\Omega_{MIN}}{\Omega_{NOM}}\right)$$

Substituting (13) in (12)

$$w^* = \dfrac{w^*_{NOM}}{1 + 2^{N-1}}\left(\dfrac{\Omega}{\Omega_{MIN}}\right)$$

$$\therefore \dfrac{w^*}{\frac{\Omega}{\Omega_{MIN}}} = \dfrac{w^*_{NOM}}{1 + \frac{2^{N-1}}{P}} \quad (14)$$

Substituting (14) in (11)

$$w^*(n) = \dfrac{2^N w^*_{NOM}}{P\left(1 + \dfrac{2^{N-1}}{P}\right)}$$

i.e. $w^*(n) = w^*_{CO} = \dfrac{2^N}{(R^*C^*)_{NOM}}(P + 2^{N-1}) \quad (15)$

From (7)

$$\delta v = \dfrac{V \cdot 2^N}{P \cdot f_c} \cdot \Omega_{MIN}$$

also $\delta v = V\left(\dfrac{C_1}{C_o}\right)$ $$\therefore \Omega_{MIN} = P \cdot \dfrac{f_c}{2^N}\left(\dfrac{C_1}{C_o}\right)$$

From (13)

$$\Omega_{NOM} = \Omega_{MIN}\left(\dfrac{\Omega_{NOM}}{\Omega_{MIN}}\right) = P \cdot \dfrac{f_c}{2^N}\left(\dfrac{C_1}{C_o}\right)\left(1 + \dfrac{2^{N-1}}{P}\right)$$

i.e. $\dfrac{1}{(RC_o)_{NOM}} = \dfrac{f_c}{2^N}\left(\dfrac{C_1}{C_o}\right)(P + 2^{N-1})$ $$\therefore (RC_1)_{NOM} = \dfrac{2^N}{f_c(P + 2^{N-1})} = (R^*C^*)_{NOM} \cdot \dfrac{w^*_{co}}{f_c} \quad (16)$$

since from (15)

$$\dfrac{2^N}{P + 2^{N-1}} = (R^*C^*)_{NOM} w^*_{co}$$

$$\therefore w^*_{co} = f_c\left(\dfrac{R}{R^*}\right)\left(\dfrac{C_1}{C^*}\right) \quad (17)$$

Equations (15) and (17) show that the filter cut-off frequency $w^*_{co}$ is independent of n. That is for a complete set of processing conditions defined by $\Omega_{(n)}$ for $0 \leq n \leq 2^{N-1}$ the filter cut off frequency is unchanged and depends only on the clock signal frequency $f_c$ and the ratios of the integrated capacitors and resistors. These parameters can all be accurately reproduced.

The value of the capacitance $C_o$ of the capacitor TC2 does not influence the performance of the trimming circuit and need only be chosen to limit the voltage excursion at the output of the integrator, i.e. to prevent saturation of the amplifier TA1.

The maximum voltage at the output of the integrator is given by $$v_{MAX} = (2^N + P)\delta v$$

$$= (2^N + P) \cdot V \cdot \left(\dfrac{C_1}{C_o}\right)$$

$$\therefore C_o = (2^N + P) \cdot \dfrac{V}{v_{MAX}} \cdot C_1 \quad (18)$$

The quantization error, E, can be expressed as the peak error between the ideal and quantized characteristics shown in FIG. 4

$$\therefore E = \pm \dfrac{\Omega_{(n+1)} - \Omega_{(n)}}{\Omega_{(n+1)} + \Omega_{(n)}} \times 100\%$$

From (4)

$$E = \pm \dfrac{\Omega_{MIN}\left(1 + \dfrac{n + \frac{3}{2}}{P}\right) - \Omega_{MIN}\left(1 + \dfrac{n + \frac{1}{2}}{P}\right)}{\Omega_{MIN}\left(1 + \dfrac{n + \frac{3}{2}}{P}\right) + \Omega_{MIN}\left(1 + \dfrac{n + \frac{1}{2}}{P}\right)} \times 100\%$$

$$= \pm \dfrac{100}{2P + 2n + 2}\%$$

This is a maximum when $n = 0$ $$\therefore E_{MAX} = \pm \dfrac{50}{P + 1}\% \quad (19)$$

The range of cut-off frequencies produced by processing spreads which can be compensated for can be expressed as S where $$S = \pm \dfrac{\Omega_{MAX} - \Omega_{MIN}}{\Omega_{MAX} + \Omega_{MIN}} \times 100\% \quad (20)$$

$$= \pm \dfrac{100}{1 + \dfrac{P}{2^{N-1}}}\%$$

Equations (19) and (20) illustrate how a filter having an uncompensated spread S can be improved to give a compensated spread given by $E_{MAX}$.

Table 1 shows uncompensated (U) and compensated (C) spreads in filter cut-off frequency for various values of N and P.

TABLE I

| N | 3 | | 4 | | 5 | | 6 | |
|---|---|---|---|---|---|---|---|---|
| P | U | C | U | C | U | C | U | C |
| $2^N$ | ±33% | ±5.5% | ±33% | ±2.94% | ±33% | ±1.5% | ±33% | ±0.76% |

TABLE I-continued

| N | 3 | | 4 | | 5 | | 6 | |
|---|---|---|---|---|---|---|---|---|
| P | U | C | U | C | U | C | U | C |
| $2^{N-1}$ | ±50% | ±10% | ±50% | ±5.5% | ±50% | ±2.94% | ±50% | ±1.5% |
| $2^{N-2}$ | ±67% | ±16.6% | ±67% | ±10% | ±67% | ±5.5% | ±67% | ±2.94% |

EXAMPLE

Assume that
(1) S = ±50%,
(2) $E_{MAX} \leq 3\%$.
(3) $f^*_{co} = 80$ KHz, and
(4) fc = 160 KHz.
From Table 1 choose N = 5  P = $2^{N-1}$ = 16.

Figure 5:
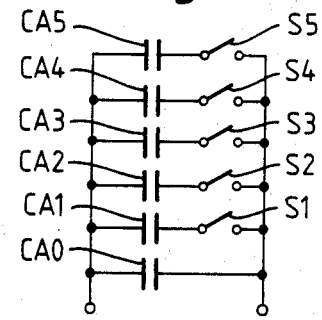
FIG. 5 shows a capacitor network illustrating a practical compensation example.

From (15) $(R^*C^*)_{NOM} = \dfrac{1}{2\pi \cdot 80 \cdot 10^3} \cdot \dfrac{32}{16 + 16} = 1.989 \cdot 10^{-6}$ for $C^*_{NOM} = 16pF$; $R^*_{NOM} = \dfrac{1.989 \cdot 10^{-6}}{16^* \cdot 10^{-12}} = 0.124 M\Omega$ From (16) $(RC1)_{NOM} = .989 \cdot 10^{-6} \cdot \dfrac{2\pi \cdot 80 \cdot 10^3}{160 \cdot 10^3} = 6.25 \cdot 10^{-6}$ for $C1_{NOM} = 16pF$; $R = \dfrac{6.25 \cdot 10^{-6}}{16^* \cdot 10^{-12}} = 0.39 M\Omega$ The values of the capacitors in the capacitor array shown in FIG. 5 are then as follows:
CA0 = 8.25 pF
CA1 = 0.5 pF
CA2 = 1.0 pF
CA3 = 2.0 pF
CA4 = 4.0 pF
CA5 = 8.0 pF If, in a given circuit, the counted increments n = 26 then the value of $$C^*_{(n)} = \dfrac{C^*}{2^N} (P + n + \tfrac{1}{2})$$

$$= \dfrac{16}{2^5} (16 + 26 + \tfrac{1}{2})$$

$$= \dfrac{16}{32} 42.5$$

$$= 20.25 pF.$$

The counter output n in binary form is 11010 and hence switches 55, 54, and 52 are made and the capacitor array connected across the amplifier A1 comprises capacitors CA5, CA4, CA2 and CA0 whose total capacitance is 20.25 pF.

Figure 6:
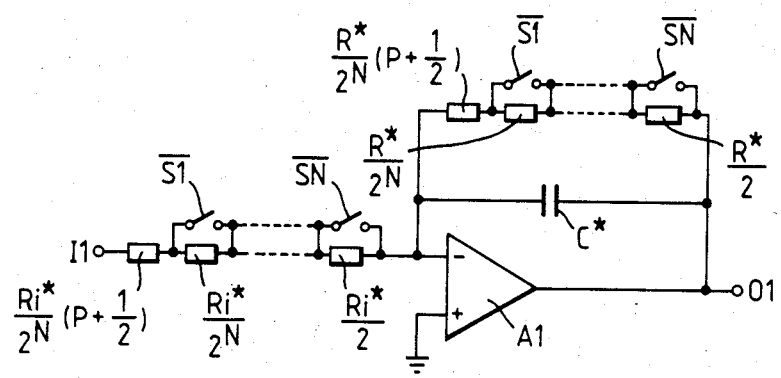
FIG. 6 shows a second embodiment of a first order active low pass filter including a trimming circuit for adjusting the product of a resistor and a capacitor.

FIG. 6 shows a first order filter in which the resistors are adjustable instead of the capacitor. This may have advantages when higher order filters are desired since they do not always have solutions with equal valued capacitors but normally do have solutions with equal valued resistors. The programming is made easier if all the values are the same. It should be noted that although in theory the corrections for unequal valued capacitors are the same, i.e. the capacitance ratios remain constant, the difference in value between the lowest and highest required values becomes unwieldy and makes them difficult to fabricate.

With a first order filter as shown in FIGS. 1 and 6 there are advantages in using a capacitor array in that only one capacitor needs adjustment. When the adjustment is applied to the resistance values it is desirable to adjust both $R_i$ and $R_f$ in order to keep the gain constant. The arrangement shown in FIG. 6 uses the same trimming circuit as that of FIG. 2. However, since opening the switches S1 to SN increases the resistance, inverted values from the shift register 13 should be used to control the switches or the switches themselves should operate with signals of opposite polarity. With higher order filters the number of resistors and capacitors tends to be more nearly equal and hence there is no significant difference in the number of switches required. The number of components (resistors or capacitors) which can be adjusted using a single trimming circuit is limited only by the number of switches which can be controlled from a single register output. This can be increased if desired by using the register outputs to drive multiple driving circuits.

Various modifications may be made to the trimming circuit. For example, instead of using the output of the comparator TA2 to load the N bit register 13 with the counter state, it would be possible to stop the counter cycling at that time and use the counter outputs directly to control the switches S1 to SN. The advantage of the arrangement shown in FIG. 2 is that it compensates for long term drift due to ageing and temperature variations.

If the processing spreads are outside the limits of correction set by the chosen values of N and P it is possible for an inappropriate correction to be made. For example when the value is less than $\Omega_{MIN}$ the counter 11 will not have been reset before v crosses zero and hence the switches will be programmed for a setting appropriate to spread at the opposite end of the scale. Since this is outside the designed for tolerance it could be considered that the circuit is faulty and should be discarded in any case. However, an alternative approach is to set the switches to the state equivalent to $\Omega_{MIN}$ in this case. This may be achieved by detecting that the zero crossing of v occurs between times $t_3$ and $t_4$, i.e. during the pulse $Q_{N+1}$ and using this information to force the counter state to zero. A similar situation occurs at the other end of the processing spread $\Omega_{MAX}$. In this event it can be detected that v does not reach zero before $t_5$. In which case the counter is forced to the maximum count so that the switches S1 to SN are selected to give a correction appropriate to $\Omega_{MAX}$.

An alternative to the trimming circuit described is to transfer a charge from a further capacitor to the capacitor TC2 in a first period and to discharge the capacitor TC2 through a resistor in a second period. A counter is started at the beginning of the second period and stopped when the capacitor TC2 is discharged, i.e. v = 0. The state of the counter again programmes the switches S1 to SN. Again the count reached by the counter will depend on the processing spreads, the total charge transferred and hence the discharge time is representative of the absolute capacitance and resistance values.

Figure 7:
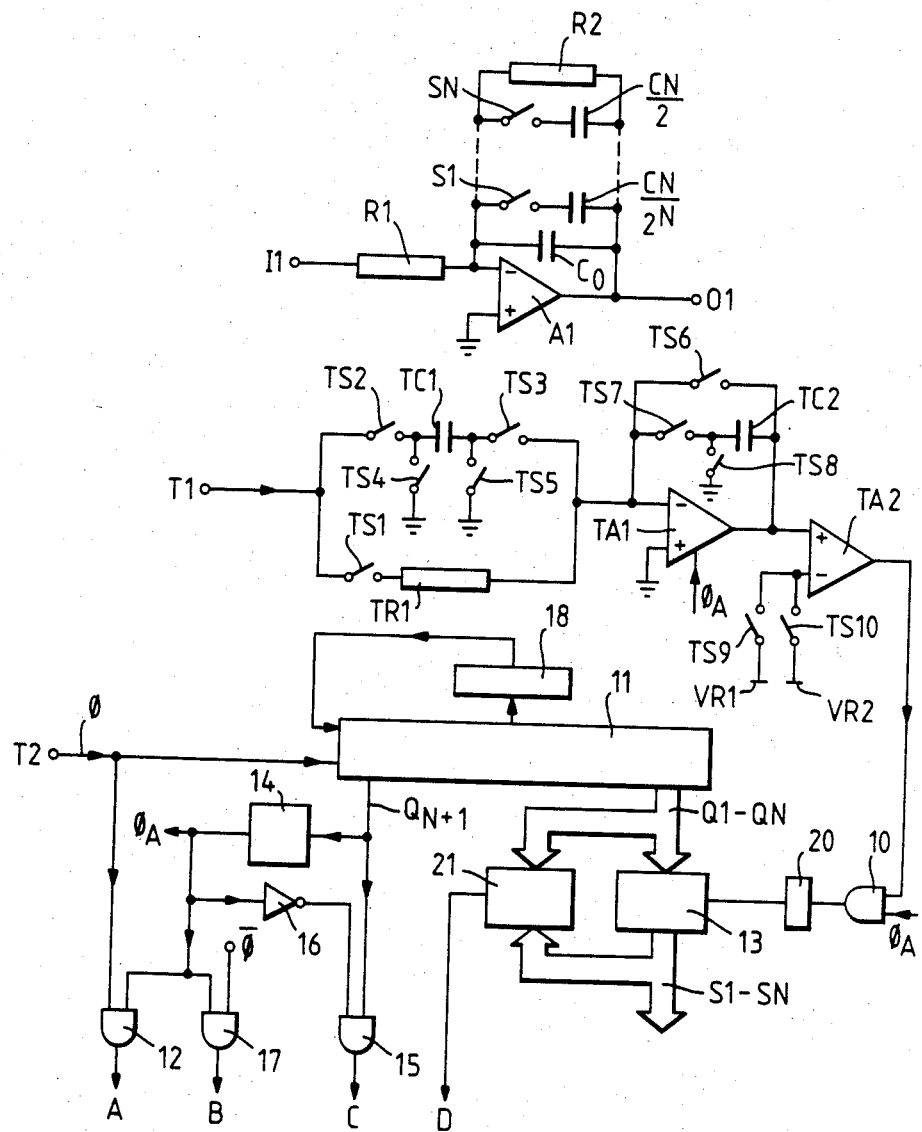
FIG. 7 shows a third embodiment of a first order active low pass filter including a trimming circuit for adjusting the product of a resistor and a capacitor.
Figure 9:
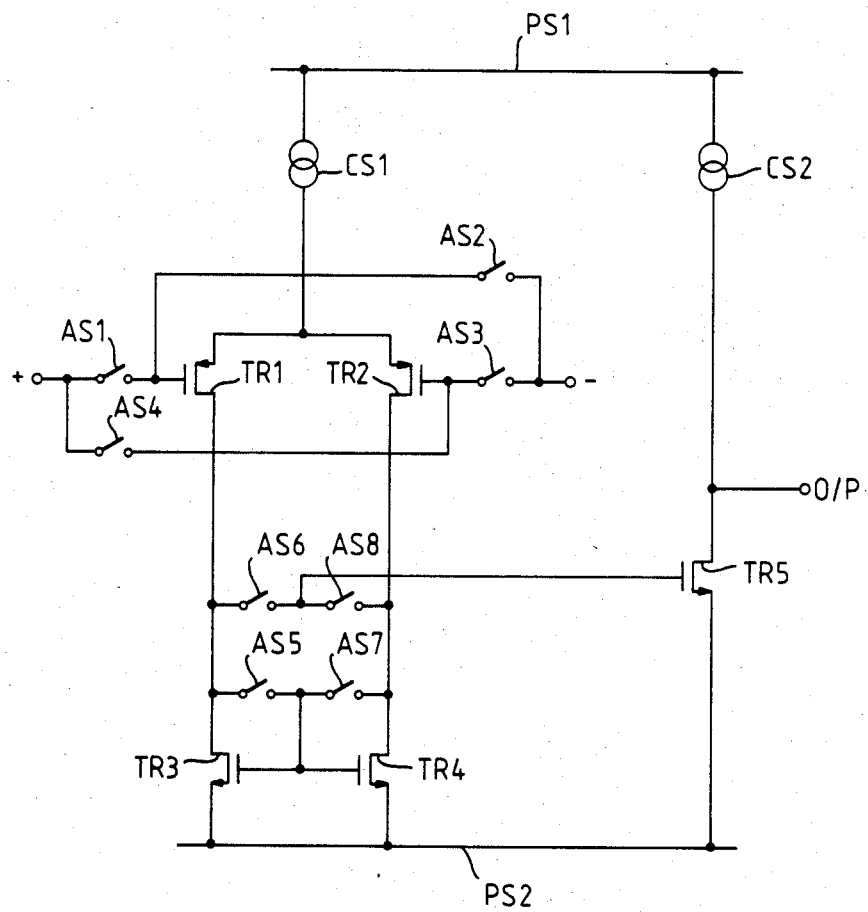
FIG. 9 shows an embodiment of an operational amplifier for use in the trimming circuit of FIG. 7.

FIG. 7 shows a third embodiment of a first order active low pass filter which is a modified version of that shown in FIG. 2. Equivalent elements in FIG. 7 have been given the same reference numerals as those in FIG. 2. Only the changes from the embodiment shown in FIG. 2 and described with reference thereto will be described in detail hereinafter. The differential amplifier TA1, an example of which is shown in FIG. 9, is provided with a further input which is fed with the signal $\phi_A$. This signal causes the amplifier TA1 to be internally re-arranged at the clock frequency of the signal $\phi_A$ and this is used to cancel the effects of voltage offsets at its input. A switch TS7 is connected between the inverting input of amplifier TA1 and the capacitor TC2, while a switch TS8 is connected between ground and the junction of the capacitor TC2 and the switch TS7.

The differential amplifier TA2 has been modified by connecting its inverting input to two reference voltage sources VR1 and VR2 via respective switches TS9 and TS10. The counter outputs Q1-QN are connected to a first set of inputs of a comparator 21 in addition to the inputs of the register 13, while the outputs S1-SN of the register 13 are additionally connected to a second set of inputs of the comparator 21. The output D of the comparator 21 is used to control the operation of the switches TS9 and TS10.

The omparator 21, switches TS9 and TS10 and reference voltage sources VR1 and VR2 form a hysteresis circuit which reduces the tendency of the programming outputs S1-SN to change due to noise on the signal applied to the amplifier TA1. The voltage VR1 may be +5 mV and the voltage VR2 -5 mV, the switch TS9 being operated when the comparator 21 does not detect equality, and the switch TS10 when the comparator 21 detects equality. In this way noise on the incremental charges fed to capacitor TC2 is less likely to affect the point at which the amplifier TA2 detects that the charge on capacitor TC2 has been reduced to zero, since on the step before the expected increment the reference voltage if +5 mV rather than ground and on the step of the expected increment the reference voltage is -5 mV. In this context the expected increment is the increment corresponding to the increment which produced zero charge on capacitor TC2 during the previous cycle, i.e. the increment number stored in the register 13. This means that a noise level of 5 mV can be superimposed on the step before the expected increment without a false change of programming count. Similarly, on the expected increment a 5 mV noise signal in the opposite direction can be tolerated before the zero charge is not detected. The +5 mV levels are given only as an example, the actual level used will depend on the step size and the noise immunity required in a particular embodiment.

The switches TS7 and TS8 are used to cancel offsets in the amplifier Ta1 using the property of the amplifier Ta1 that its offset voltage is reversible by means of the further input fed with the signal $\phi_A$. From time $t_1$ to $t_2$ the switches TS6 and TS8 are closed and TS7 is open. Consequently the capacitor TC2 is precharged to the offset voltage x produced by the amplifier TA1. From time $t_2$ to $t_3$ switch TS7 is closed and switches TS6 and TS8 are open. The output voltage v of the amplifier TA1 goes initially to 2x and then changes negatively. After $2^N$ periods of the clock A the voltage at the output of the amplifier TA1

$$v = 2x - 2^N(V-x)/f_cR_oC_o$$

and the voltage across the capacitor $$V_c = x - 2^N(V-x)/f_cR_oC_o$$

From time $t_3$ to $t_5$ capacitor TC1 charges to +V on A and discharges to -x on $\overline{A}$.

$$\delta v_o \text{ (step size)} = (V-x) C1/C2$$

The capacitor TC1 discharges to -x because the offset on the amplifier has been reversed by application of the signal $\phi_A$ to its further input.

After n increments the outputs of the amplifier TA1

$$\begin{aligned}v &= V_c - x + n\delta v_o \\ &= x - 2^N(V-x)/f_c \cdot R_oC_o - x + n(V-x)C1/C2 \\ &= -(V-x)(2^N/f_cR_oC_o - nC1/C2)\end{aligned}$$

and thus the performance is insensitive to offsets.

Figure 8:
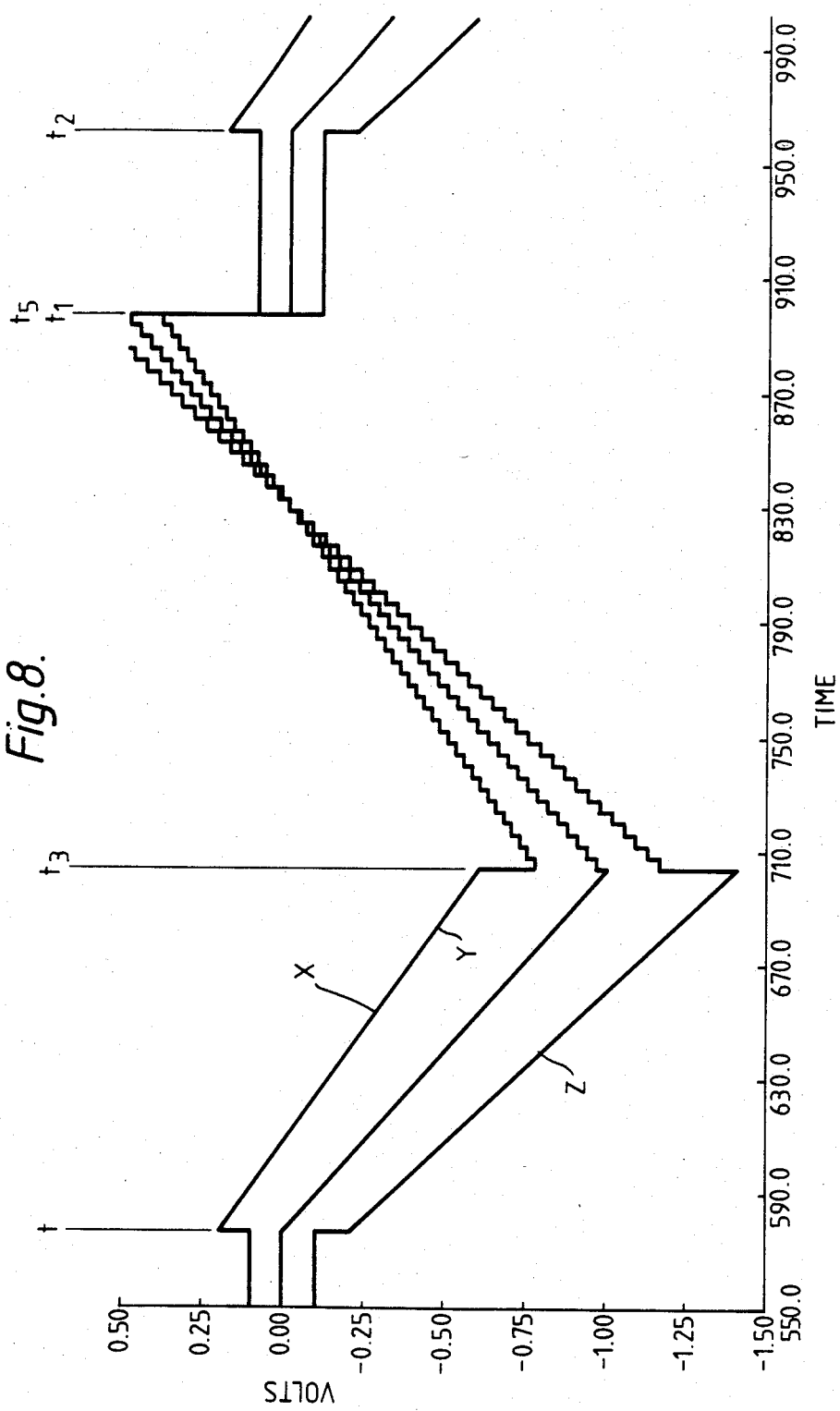
FIG. 8 shows various waveforms in the embodiment shown in FIG. 7.

FIG. 8 shows the effect of this arrangment on the output of the amplifier TA1 with zero offset (waveform Y), +100 mV offset (waveform X), and +100 mV offset (waveform Z). It can be seen from FIG. 8 that all of the waveforms cross at an output voltage of zero regardless of the offset voltage. It can also be seen that the magnitude of the incremental steps varies with the offset.

FIG. 9 shows an embodiment of an amplifier suitable for use as the amplifier TA1. The amplifier shown in FIG. 9 comprises two FETs having their source electrodes coupled through a current source CS1 to a first power supply rail PS1. The gate electrode of TR1 is connected via a switch AS1 to the non inverting input (+) of the amplifier and via a switch AS2 to the inverting input (−) of the amplifier. The gate electrode of TR2 is connected via a switch AS3 to the inverting input of the amplifier and via a switch AS4 to the non-inverting input of the amplifier. The drain electrode of TR1 is connected to the drain electrode of an FET TR3, to the gate electrodes of an FET TR4 and the FET TR3 via a switch AS5, and to the gate electrode of an FET TR5 via a switch AS6. The drain electrode of TR2 is connected to the drain electrode of TR4, to the gate electrodes of TR3 and TR4 via a switch AS7, and to the gate electrode of TR5 via a switch AS8. The source electrode of TR5 is connected to the power rail PS1 via a current source CS2. The source electrodes of TR3 and TR4 and the drain electrode of TR5 are connected to a second power supply rail PS2. The output of the amplifier is taken from the junction of TR5 and CS2.

In operation during the period $t_1$ to $t_3$ switches AS1, AS3, AS5 and AS8 are closed and switches AS2, AS4, AS6 and AS7 are open. Consequently the non-inverting input (+) is connected to TR1, TR3 forms the diode of the current mirror comprising TR3 and TR4, and the output is taken from the drain of TR4. During the period $t_3$ to $t_5$ switches AS1, AS3, AS5 and AS8 are open and switches AS2, AS4, AS6 and AS7 are closed. Consequently the non-inverting input (+) is connected to TR2, TR4 forms the diode of the current mirror comprising TR3 and TR4, and the output is taken from the drain of TR3. Since the positions of TR1 and TR2 are interchanged and the positions of TR3 and TR4 are also interchanged any offsets will be of equal magnitude but opposite sign. Thus this amplifier may be used in the offset cancelling arrangement described with respect to FIG. 7.

Figure 10:
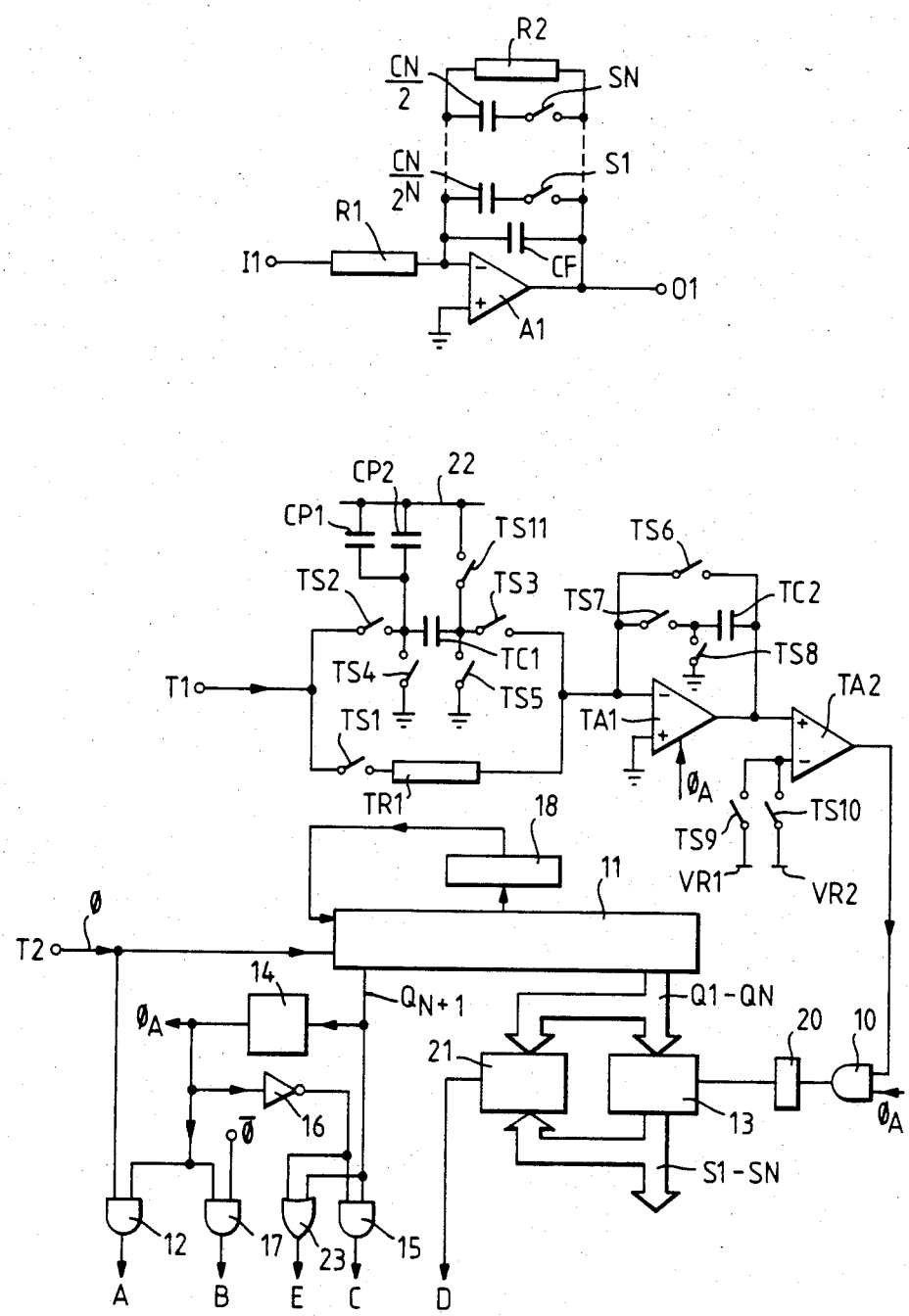
FIG. 10 shows the embodiment of FIG. 7 modified in accordance with the invention to take into account parasitic capacitances.

FIG. 10 shows an embodiment of a filter according to the invention. The filter of FIG. 10 is similar to that shown in FIG. 7 and corresponding elements have been given the same reference signs. The construction and operation of this embodiment will only be described in so far as it differs from that shown in FIG. 7.

Figure 12:
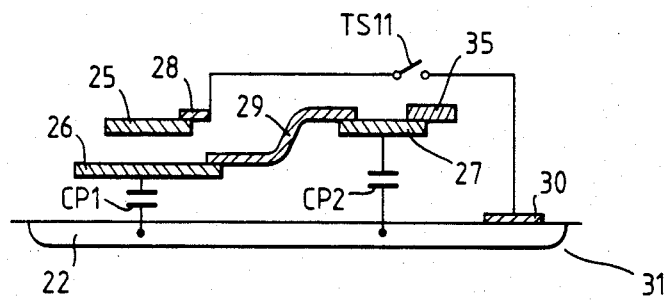
FIG. 12 shows the structure in elevation of the trimming circuit used in the embodiment of FIG. 10 when implemented by a particular integration process.
Figure 13:
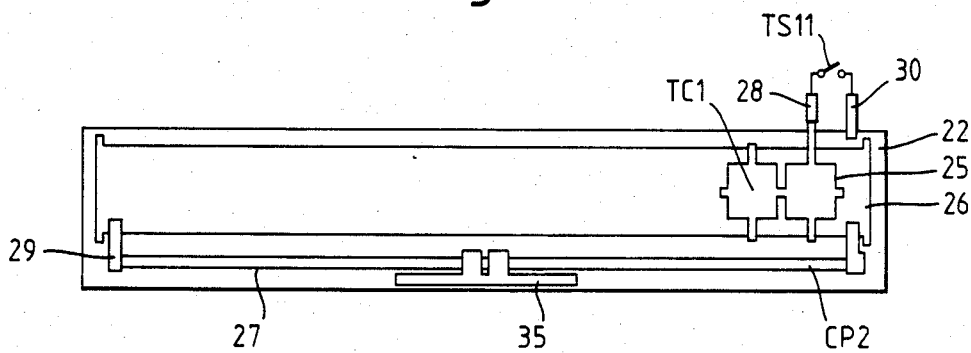
FIG. 13 shows the structure in plan view of the trimming circuit shown in FIG. 11.

The trimming circuit in FIG. 10 is modified with respect to that shown in FIG. 7 in that an electrically conductive layer 22, for example an n-well, is formed under the capacitor TC1 and a dummy resistor (see also FIGS. 12 and 13). The parasitic capacitances between capacitor TC1 and the n-well (CP1) and between the dummy resistor and the n-well (CP2) are connected in parallel with the capacitor TC1 by means of a switch TS11. This switch is closed during the period from $t_2$ to $t_4$. In order to achieve this a signal E is generated by an OR gate 23 which has a first input connected to the output of inverter 16 and a second input connected to the $Q_{N+1}$ output of the counter 11.

In the arrangements shown in FIGS. 2 to 9 the bottom plate capacitance, i.e. the parasitic capacitance between the bottom plate of the capacitor TC1 and the substrate, was eliminated by either grounding the bottom plate or, for floating capacitors, connecting to the output of the operational amplifier. With the arrangement shown in FIG. 10 the bottom plate parasitic capacitance (CPA) of the filter capacitor array is connected to a conductive layer (n-well 22) which is connected to ground or, for floating capacitors to the output of an operational amplifier or other stray insensitive point. The structure of the capacitor(s) and resistor(s) in the filter is, of course, made the same as that of capacitor TC1 and dummy resistor in the trimming circuit.

However this arrangement changes the value of the fixed capacitor CF from the designed value of $(C/2^N)(P+\frac{1}{2})$ which leads to an error in the frequency response. The arrangement shown in FIG. 10 compensates for this error.

During the period E, that is from $t_2$ to $t_4$, the bottom of parasitic capacitance CP1 of the capacitor TC1 is connected in parallel with the capacitor TC1 and therefore $$\delta v_1 = V \cdot (C_1 + CP_1)/C_0 \quad (21)$$

and $$\delta v_2 = V \cdot C_1/C_0 \quad (22)$$

where CO is the capacitance of capacitor TC2 and Cl is the capacitance of capacitor TC1.

Figure 11:
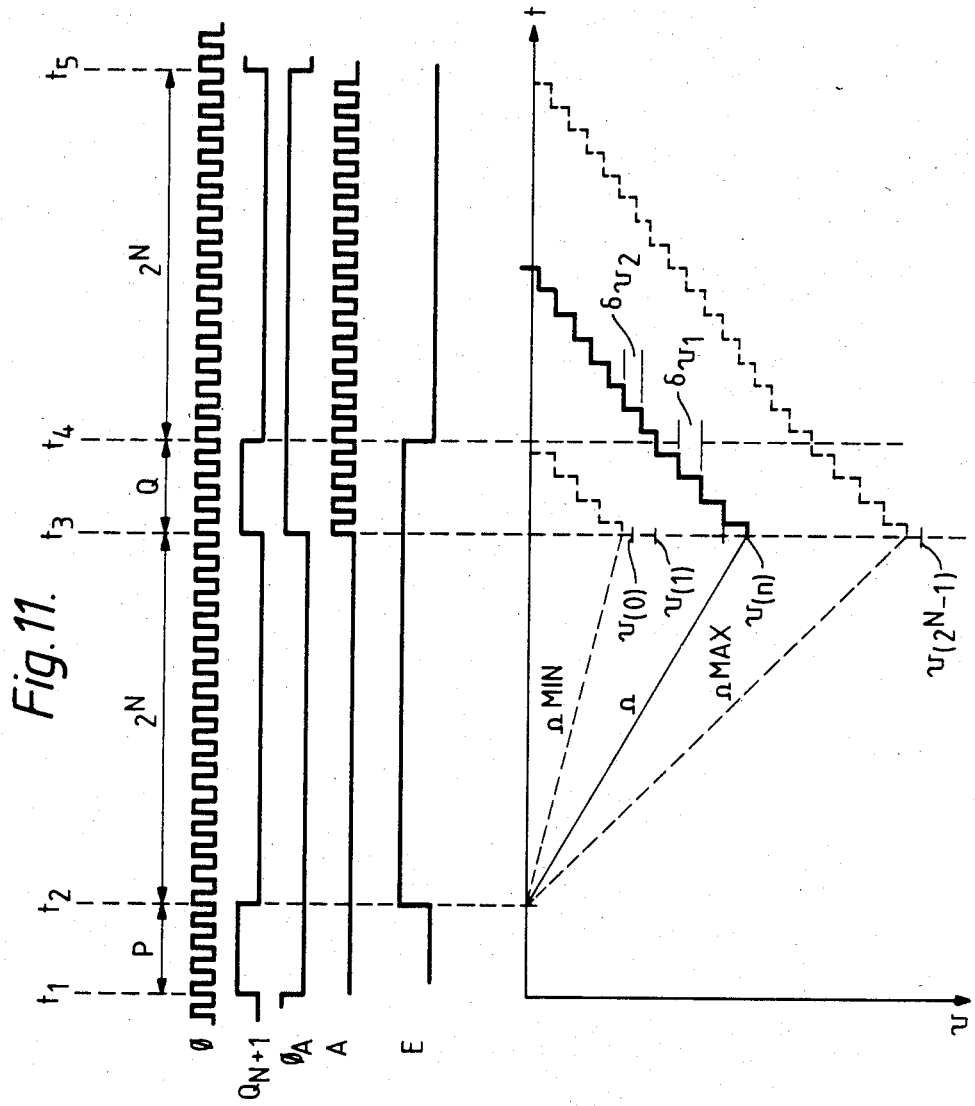
FIG. 11 shows various waveforms in the filter of FIG. 10.

These equations (21) and (22) are derived in the same way as equation (2). Thus the staircase discharge of capacitor TC2 has two distinct slopes, one between times $t_3$ and $t_4$ and the other between times $t_4$ and $t_5$. This can be seen from FIG. 11 which shows waveforms in the circuit of FIG. 10.

The integrator output voltage v after n steps is $$v = v + P\delta v_1 + n\delta v_2$$

$$= -V \cdot 2^N/f_cR1 \cdot C0 + P \cdot V(C1 + CP1)/C0 + nV \cdot C1/C0$$

at zero crossing $v=0$.

$$\therefore 2^N/f_cR1C1 = P[(C1 + CP1)/C0] + n$$

or $n = 2^N/f_cR1C1 - P(C1 + CP1)/C0$

-continued $$= 2^N\Omega/\Omega_{NOM} - P(C1 + CP1)/C0$$

or $n = n_o - P \cdot CP1/C1$ where $n_0$ count when $CP1 = 0$ $$= (2^N\Omega/\Omega_{NOM}) - P$$

∴ The capacitor array capacitance CA $$= CF + CPA + n \cdot C/2^N$$

$$= CF + CPA + (n_o - P \cdot CP1/C1)C/2^N$$

$$= CF + n_o \cdot C/2^N + [CPA - P \cdot (CP1/C1)(C/2^N)]$$

$$= CA_o + [CPA - P(CP1/C1)(C/2^N)]$$

$$\therefore CA = CA_o \text{ if } CPA = P(CP1/C1)(C/2^N)$$

i.e. $CPA/C = (P/2^N)(CP1/C1)$ or $CPA/CP1 = (P/2^N)(C/C1)$ where CPA is the stray capacitance between the bottom plates of the capacitors of the capacitor array and an underlying n-well which is connected to ground or, in the case of a floating capacitor array to a stray insensitive point such as the output of an operational amplifier.

This solution gives the correct values for controlling the filter but does not maintain the original control range. The following procedure maintains a symmetrical control range.

The interval between times $t_3$ and $t_4$ is reduced to Q clock periods (instead of P clock periods as before). The fixed element CF of the capacitor array is given the value $C \cdot (Q+\frac{1}{2})/2^N$ instead of $C \cdot (P+\frac{1}{2})/2^N$. The parasitic capacitances CPA and CP1 (in the array and trimming circuit respectively) are proportioned according to the formula $$CPA/C = (Q/2^N)(CP1/C1)$$

where $Q = P/(1 + CP1_{NOM}/C1_{NOM})$

This can be shown as follows:
The integrator output voltage v is given by $$v = v + Q \cdot \delta v_1 + n \cdot \delta v_2$$

when the integrator output is zero
$0 = -V \cdot 2^N/f_cR1C0 + [Q \cdot V \cdot (CP1+C1)/C0] + n \cdot V \cdot C1/C0$ $$\therefore n = 2^N/f_cR1C1 - Q(1+CP1/C1)$$

For $CP1=0$ $$n = n_1 = 2^N/f_cR1C1 - Q$$

$$\therefore n = n_1 - Q \cdot CP1/C1$$

In system of FIG. 2

$$n = n_o = 2^N/f_cR1C1 - P$$

$$\therefore n_1 = n_0 + P - Q$$

and $n = n_o + P - Q - QCP1/C1$

This value of n is used to program the array.

$$CA = CF + CPA + n \cdot C/2^N$$

where $CF$ is the fixed capacitor of the array $$\therefore CA = CF(Q + \tfrac{1}{2})/(P + \tfrac{1}{2}) + CPA +$$

$$C[n_0 + P - Q - Q(CP1/C1)]/2^N$$

$$= CF + n_0 \cdot C/2^N + C0(Q + \tfrac{1}{2})/(P + \tfrac{1}{2}) -$$

$$C0 + CPA + C[P - Q - Q(CP1/c1)]/2^N$$

$CF + n_0\, C/2^N$ is the nominal array value $CA_o$ $\therefore CA = CA_o$ if the remaining terms sum to zero.

i.e. if $CF \cdot (Q + \tfrac{1}{2})/(P + \tfrac{1}{2}) - CF + CPA +$ $$C[P - Q - Q(CP1/C1)]/2^N = 0$$

$$\therefore CF(Q - P)/(P + \tfrac{1}{2}) + CPA + C(P - Q)/2^N -$$

$$Q(C/2^N)(CP1/C1) = 0$$

but $CF = C(P + \tfrac{1}{2})/2^N$ $$\therefore C(Q - P)/2^N + CPA + C(P - Q)/2^N -$$

$$Q(C/2^N)(CP1/C1) = 0$$

$$\therefore CPA/CP1 = (Q/2^N)(C/C1)$$

Thus if the parasitics maintain these proportions despite spreads in parasitics and in capacitors formed between two layers of polysilicon then the array capacitance achieves the same value as in the FIG. 2 or FIG. 7 arrangement. This is likely provided that CP1 and CPA derive from the same dielectric and have ratioed areas and perimeters. It should be noted the C and C1 are already derived from the same dielectric and have ratioed areas and perimeters.

Although the foregoing explanation has included only the parasitic capacitance CP1 between the capacitor TC1 and the n-well 22 it is also possible to include the parasitic capacitance CP2 between the resistor TR1 and the n-well 22 and provided that the filter resistor is similarly formed with the filter capacitor array the preceding argument holds good, i.e. the resistor parasitic is connected in parallel with the capacitor parasitic in both the trimming circuit and the filter.

Figure 14:
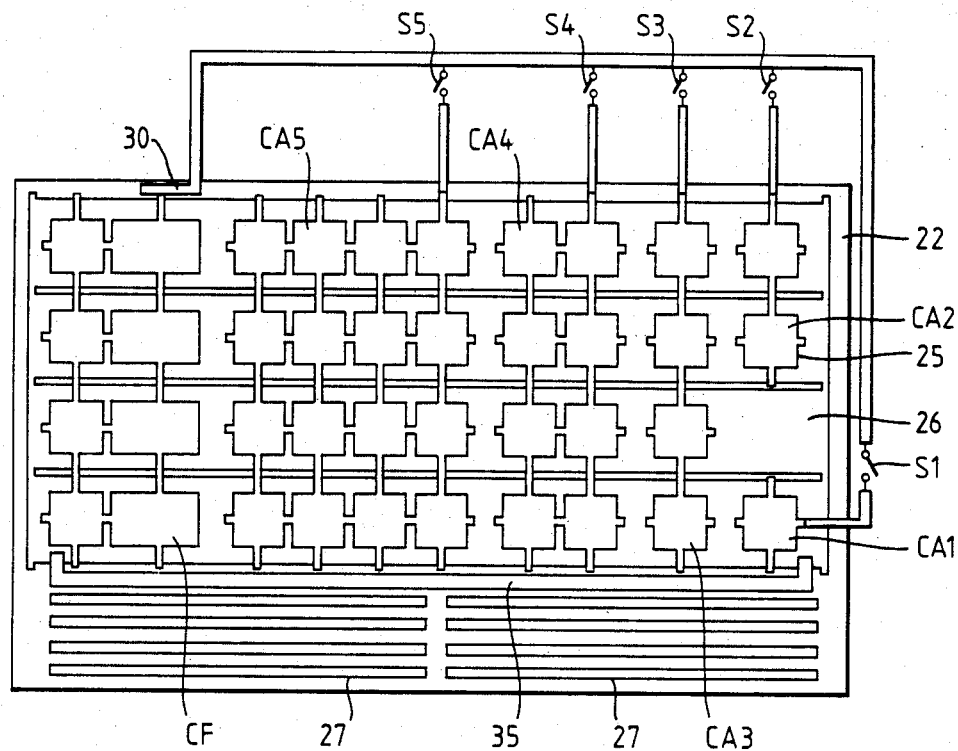
FIG. 14 shows the structure in plan view of the filter RC combination.

FIGS. 12 and 13 show the structure of the trimming circuit in elevation and plan views while FIG. 14 shows the plan view of a corresponding structure for the filter capacitor array and resistor.

The capacitor TC1 is formed above a continuous conductive layer 22, which may be in the form of an n-well. The bottom plate of the capacitor TC1 is formed by a layer of polysilicon 26 which is separated by a dielectric from the layer 22. A second polysilicon layer is formed above the first layer 26 and separated from it by a dielectric layer and an area 25 of the second polysilicon layer forms the top plate of the capacitor TC1.

A further area 27 of the second polysilicon layer forms a dummy resistor which is not used as a resistor in the trimming circuit but which contributes a parasitic capacitance CP2. This is used to compensate for the parasitic capacitance of the filter resistor where the filter resistor and capacitor combination are constructed to have an equivalent layout and structure. The bottom plate of the capacitor TC1 is connected to the dummy resistor formed by area 27 by metalisation strips 29. A metalisation strip 28 connects the top plate of capacitor TC1 to the n-well 22 via a switch TS11 and metalisation 30. A further metalisation strip 35 is connected to the dummy resistor resistor formed by area 27 and is dimensioned to compensate for the metalisation 35 on the filter resistor and capacitor structure shown in FIG. 14. Thus when switch TS11 is closed the parasitic capacitances CP1 and CP2 are connected in parallel with the capacitor TC1.

In the trimming circuit the parasitic capacitance of resistor TR1 has no effect since it is pre-charged during the period $t_1$ to $t_2$ when switches TS1 and TS6 are closed and since during the period $t_1$ to $t_3$ resistor TR1 is connected to a constant potential, i.e. between $+V$ at terminal T1 and a virtual ground.

The filter resistor and capacitor array shown in FIG. 14 is designed to have a structure of the same form as that of the trimming circuit so that parasitic capacitances and process spreads will have the same effect on this array as on the trimming circuit. The layer 26 forming the bottom plates of the capacitors of the array is split into four sections each of which are of the same form as the bottom plate of capacitor TC1. The switchable capacitors of the array have a binary relationship such that each switchable capacitor is twice the value of the previous one. The switchable capacitors are made from elemental capacitors which are connected together to form capacitors having the required values, i.e. capacitor CA1 comprises one elemental area top plate, capacitor CA2 comprises two elemental area top plates, and so on. The fixed capacitor CF is dimensioned so that with nominal values approximately half of the switchable capacitance value is used so that equal adjustment in both directions is possible.

The filter resistor is formed by four strips 27 which are of the same form as that for resistor TR1 but which have been split into two for reasons which will be explained hereinafter. The resistor strips 27 are connected together by metalisation which is arranged to produce the required resistance value from standard resistor strips 27, i.e. the strips or selected portions thereof are selectively connected in series and parallel. Thus a constant parasitic capacitance will occur between the resistor and the n-well regardless of the resistance value required for the circuit operation.

Figure 15:
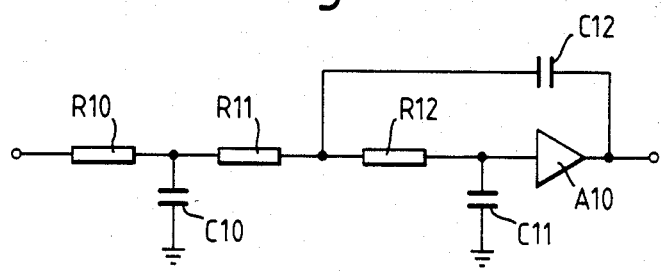
FIG. 15 is a circuit diagram of a third order low pass filter.

FIG. 15 shows a low pass filter which is to be constructed using three resistor capacitor arrays as shown in FIG. 14. The filter comprises an input 100 which is connected to one end of a series arrangement of three resistors R10, R11 and R12, the other end of which is connected to an operational amplifier A10. The junction of resistors R10 and R11 is connected to ground through a capacitor C10, the junction of resistors R11 and R12 is connected to the output of the operational amplifier A10 through a capacitor C12, and the junction of resistor R12 and the input of the operational amplifier A10 is connected to ground through a capacitor C11. The output of the operational amplifier A10 is connected to the filter output 101. This forms a conventional active low pass filter.

Figure 16:
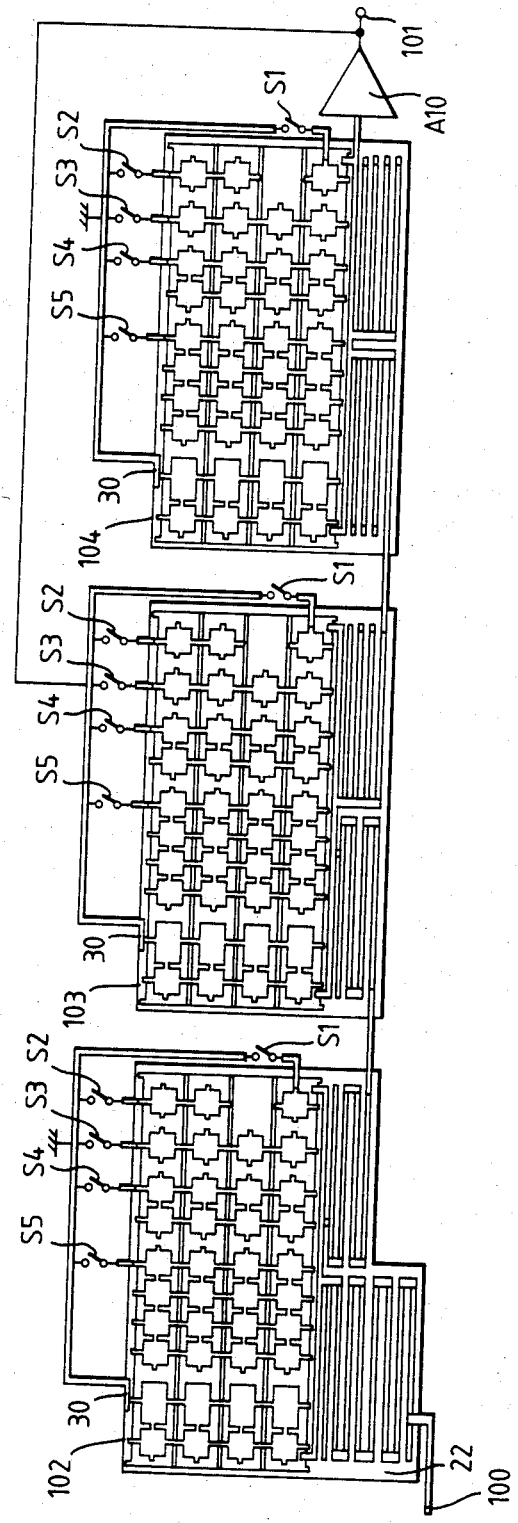
FIG. 16 shows the structure of an implementation of the third order low pass filter shown in FIG. 15.

The implementation of this filter in integrated form is illustrated in FIG. 16. This shows three resistor-capacitor arrays of the form illustrated in FIG. 14. The filter input 100 is connected to a resistor strip in the first array 102. This resistor which corresponds to resistor R10 is formed from eight strips which are connected in series and which is connected to the bottom plate of the capacitor array through the metalisation 35. The capacitor array corresponds to the capacitor C10 and the switches S1 to S5 are selectively operated by the trimming circuit (not shown in FIG. 16 but which takes the form shown in FIGS. 10, 12 and 13). The capacitor C10 is connected to ground via the metalisation 30, as is the n-well 22 which extends continuously under the resistor strips and capacitor bottom plate. The metalisation 35 is also connected to the top resistor strip of the right hand half. The four right hand resistor strips and their interconnections form half of the resistor R11, the other half being formed by the four left hand resistor strips of the array 103. The capacitor array of the array 103 forms the capacitor C12 which is connected to the output of the operational amplifier A10 and via metalisation 30 to the n-well 22 which extends under the resistor-capacitor array 103. The resistor strips forming resistor R11 are connected to the bottom plate of the capacitor array via the metalisation 35. Similarly the resistor R12 is formed by the right hand strips of array 103 and the left hand strips of the array 104 and is connected between the bottom plates of capacitors C12 and C11. The right hand resistor strips of array 104 are connected at one end to the metalisation 35 but are left open circuit at the other end. Thus they perform no function in the circuit apart from contributing their parasitic capacitances.

Figure 17:
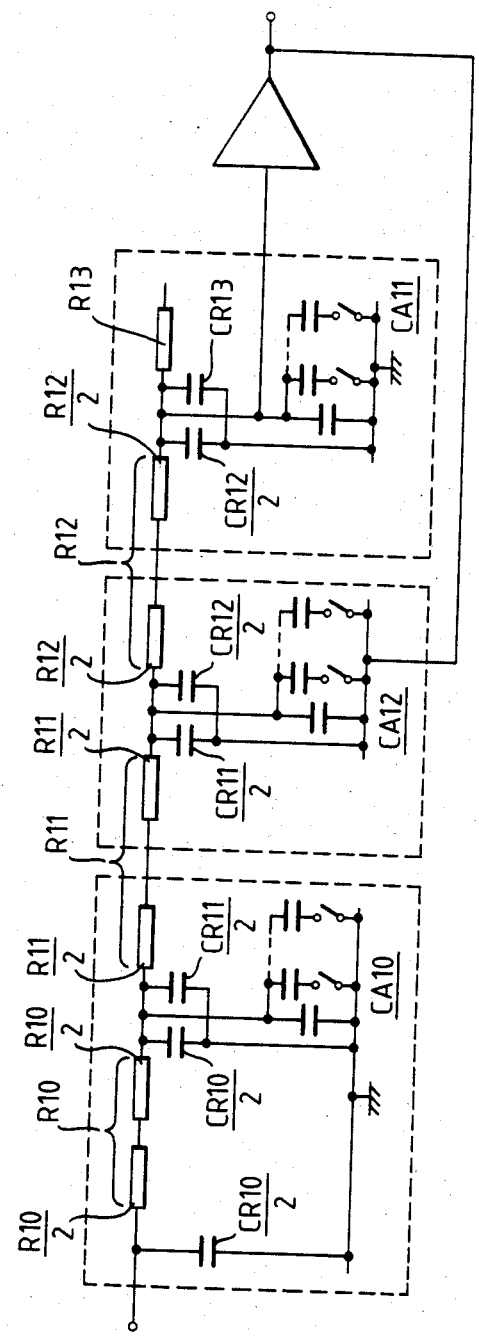
FIG. 17 is a circuit diagram of the filter implementation of FIG. 16 showing the parasitic capacitances.

FIG. 17 shows the filter circuit diagram when implemented as shown in FIG. 16 including the resistor parasitic capacitances (the parasitic capacitances of the capacitor arrays are connected in parallel with the fixed capacitance CF1 by this arrangement and are therefore not shown separately since they have been taken into account in the designed value of the fixed capacitor CF1 of the array. By splitting the resistor strips in each array into two halves and by arranging that each half of each resistor (apart from the input resistor) is located in separate adjacent arrays a better approximation to a lumped capacitor for the resistor parasitic capacitances is obtained. These "lumped" capacitors then appear in parallel with the fixed capacitor of the array. The resistor parasitic capacitances are represented in FIG. 17 by the references CR10/2, CR11/2, and CR12/2.

While the arrays shown in FIGS. 14 and 16 have comprised an array comprising four sections of the form shown in FIG. 13, this number of sections is arbitary but depends also on the values chosen for P and Q in the trimming circuit. It is convenient to make the number of sections a power of two but this is not essential.

While the foregoing description has been with reference to active filters, it is equally applicable to passive filters where the adjustment of resistors and/or capacitors is required to produce an accurately defined cut-off frequency.

From reading the present disclosure, other modifications will be apparent to persons skilled in the art. Such modifications may involve other features which are already known in the design and use of integrated electrical filters and component parts thereof and which may be used instead of or in addition to features already described herein. Although claims have been formulated in this application to particular combinations of features, it should be understood that the scope of the disclosure of the present application also includes any novel feature of any novel combination of features disclosed herein either explicitly or implicitly or any generalisation or modification of one or more of those features which would be obvious to persons skilled in the art, whether or not it relates to the same invention as presently claimed in any claim and whether or not it mitigates any or all of the same technical problems as does the present invention.

I claim:

1. An integrated electrical filter comprising at least one capacitor, at least one resistor, and a trimming circuit for adjusting the product of the resistance of the resistor and the capacitance of the capacitor, characterised in that the trimming circuit comprises means for charging a further capacitor from a reference voltage source through a further resistor for a first period comprising $2^N$ periods of a clock signal, where N is a first integer, means for removing the charge from the further capacitor in discrete increments during a second period comprising $2^N+P$ periods of the clock signal, where P is a second integer, first connection means for connecting a stray capacitance formed between the further capacitor and an underlying conductive layer in parallel with the further capacitor for a third period which comprises the first P periods of the clock signal occurring during the second period, means for counting the number of increments required to remove the charge accumulated on the further capacitor during the first period, and means for adjusting the value of said at least one capacitor or said at least one resistor in dependence on the number of increments counted.

2. A filter as claimed in claim 1, characterised in that it further comprises second connection means for connecting the stray capacitance between the further resistor and an underlying conductive layer in parallel with the further capacitor for the third period.

3. A filter as claimed in claim 2, characterised in that the first and/or second connection means comprises a switch.

4. A filter as claimed in claim 3, characterised in that a continuous conductive layer underlies both the further capacitor and the further resistor, and that the first and second connection means comprises a switch connecting the underlying layer to the plate of the capacitor remote from the underlying conductive layer.

5. A filter as claimed in claim 2, characterized in that a continuous conductive layer underlies both the further capacitor and the further resistor, and that the first and second connection means comprises a switch connecting the underlying layer to the plate of the capacitor remote from the underlying conductive layer.

6. A filter as claimed in claim 1, characterised in that said at least one capacitor comprises a fixed capacitor and N associated capacitors, each of the N associated capacitors being connected in parallel with the fixed capacitor via a respective associated switch, the operation of the associated switches being controlled by said adjusting means wherein the fixed and associated capacitors are formed above a continously extending conductive layer and means are provided for connecting the stray capacitance between the fixed capacitor and the underlying conductive layer and between the associated capacitors and the underlying conductive layer in parallel with the fixed capacitor.

7. A filter as claimed in claim 6, characterised in that said at least one resistor is formed above the same conductive layer as the at least one capacitor, and means are provided for connecting the capacitance between the at least one resistor and the underlying layer in parallel with the fixed capacitor.

8. A filter as claimed in claim 7, characterised in that it comprises a plurality of resistors and capacitors forming a ladder network, the resistors forming the series elements and the capacitors the shunt elements, in which half of each resistor connected to a single capacitor is formed above the conductive layer associated with that capacitor.

9. A filter as claimed in claim 8, characterised in that each resistor has the same dimensions, the resistance value being selected by connecting at selected points within its area.

10. A filter as claimed in claim 1 wherein the first connection means comprises a switch.

11. A filter as claimed in claim 9, characterized in that said at least one capacitor comprises a fixed capacitor and N associated capacitors, each of the N associated capacitors being connected in parallel with the fixed capacitor via a respective associated switch, the operation of the associated switches being controlled by said adjusting means wherein the fixed and associated capacitors are formed above a continuously extending conductive layer and means are provided for connecting the stray capacitance between the fixed capacitor and the underlying conductive layer and between the associated capacitors and the underlying conductive layer in parallel with the fixed capacitor.

* * * * *